United States Patent [19]

Vosteen et al.

[11] Patent Number: 4,853,639

[45] Date of Patent: Aug. 1, 1989

[54] NON-CONTACTING VOLTAGE METERING APPARATUS

[75] Inventors: William Vosteen, Waterport; Mason F. Cox, Shelby, both of N.Y.

[73] Assignee: Monroe Electronics, Inc., Lyndonville, N.Y.

[21] Appl. No.: 243,120

[22] Filed: Sep. 7, 1988

Related U.S. Application Data

[63] Continuation of Ser. No. 917,144, Oct. 9, 1986, abandoned.

[51] Int. Cl.$^4$ .................................................. G01R 29/12
[52] U.S. Cl. .................................... 324/457; 324/458; 324/79 R
[58] Field of Search ............... 324/72, 79 R, 457, 458; 361/179, 184, 181

[56] References Cited

U.S. PATENT DOCUMENTS

| | | | |
|---|---|---|---|
| 3,525,936 | 8/1970 | Vosteen | 324/458 |
| 3,611,127 | 10/1971 | Vosteen | 324/72 |
| 3,729,675 | 4/1973 | Vosteen | 324/72 |
| 3,753,117 | 8/1973 | Downing et al. | 324/72 X |
| 3,878,459 | 4/1975 | Hanna | 324/72 X |
| 3,887,877 | 6/1975 | Vosteen | 324/72 |
| 3,921,087 | 11/1975 | Vosteen | 324/794 |
| 4,106,869 | 8/1978 | Bushheit | 324/457 X |
| 4,139,813 | 2/1979 | Shaffer | 324/457 |
| 4,147,981 | 4/1979 | Williams | 324/458 |
| 4,205,267 | 5/1980 | Williams | 324/458 |
| 4,272,719 | 6/1981 | Niki et al. | 324/72 |
| 4,370,616 | 1/1983 | Williams | 324/457 X |

FOREIGN PATENT DOCUMENTS

1174881 8/1985 U.S.S.R. .................... 324/458

Primary Examiner—M. H. Paschall
Assistant Examiner—A. Jonathan Wysaki
Attorney, Agent, or Firm—Finnegan, Henderson, Farabow, Garrett & Dunner

[57] ABSTRACT

A non-contacting voltage metering device for monitoring the electrical potential of a test surface includes a sensing integrator, and a tuning fork mechanism for modulating the capacitive coupling. The integrator input is coupled to the amplifier output and the integrator output is connected to a high-voltage FET output amplifier. The apparatus includes a feedback circuit with a phase sensitive detector which has an input coupled to the integrator output and an output coupled to the integrator input, and a reference terminal coupled to the modulating mechanism for receiving the predetermined frequency.

10 Claims, 7 Drawing Sheets

NON-CONTACTING VOLTAGE METERING APPARATUS

This application is a continuation, of application Ser. No. 917,144, filed Oct. 9, 1986 abandoned.

BACKGROUND OF THE INVENTION

1. Field of the Invention

This invention relates generally to a non-contacting voltage metering apparatus for monitoring the electrical voltage of a test surface. More specifically, this invention relates to a non-contacting voltage metering apparatus having improved high frequency response.

2. Background Information

It is known in the art to measure the electrostatic field and potential of a test surface using a non-contacting voltage metering apparatus employing means for modulating the capacitance between the metering apparatus and a test surface to be measured. Such apparatus is shown, for example, in U.S. Pat. No. 3,611,127 to Vosteen and assigned to the assignee of the present invention.

While such metering apparatus is highly accurate and stable, the frequency range, or bandwidth, over which the metering apparatus may effectively operate is limited by the frequency at which the capacitance is modulated.

Typically, the alternating current (AC) potential of the surface under test may not be adequately measured for AC voltages in excess of one-half the frequency of modulation. For example, a conventional metering apparatus having a modulating frequency between 1000 and 2000 hertz, will have a maximum frequency response of between 500 and 1000 hertz.

Various techniques have been used in the prior art to increase the frequency range for voltage metering apparatus. For example, metering apparatus having somewhat higher frequency response is known which utilizes a preamplifier and an integrator having a high frequency response path therebetween for high frequency signals. However, the introduction of the modulating frequency signal, which is itself a signal of relatively high frequency, into the integrator limits long-term stability in the metering apparatus.

Accordingly, an object of the present invention is to provide an accurate, stable, non-contacting voltage metering apparatus for measuring the electrostatic field and potential of a test surface, wherein the metering apparatus has an improved high frequency response.

A further object of the invention is to provide a metering apparatus which has improved noise immunity.

Another object of the present invention is to provide a metering apparatus having improved high voltage measuring capability.

Additional objects and advantages of the invention will be set forth in the description which follows, and in part will be obvious from the description or may be learned by practice of the invention.

SUMMARY OF THE INVENTION

To achieve the objects, and in accordance with the purposes of the invention as embodied and as broadly described herein, the invention provides high-speed non-contacting voltage metering apparatus for monitoring the electric potential of a test surface. The apparatus comprises a reference surface; an electrode coupled to the reference surface and having an electrode surface and an output terminal; the electrode surface being capacitively coupled to the test surface; means for modulating the capacitive coupling between the test surface and the electrode surface at a predetermined frequency; amplifying means having an input and an output for amplifying a voltage present on the electrode output terminal; an integrator having an input and an output, the integrator input being coupled to the output of the amplifying means output; a feedback circuit comprising a phase sensitive detector having an input coupled to the integrator output and an output coupled to the integrator input, and a reference terminal coupled to the modulating means for receiving the predetermined frequency; and a high voltage amplifier having an input coupled to the integrator output, and an output connected to the reference surface.

The accompanying drawings, which are incorporated in and which constitute a part of this specification, illustrate preferred embodiments of this invention, and together with the description, explain the principals of this invention.

DESCRIPTION OF THE PREFERRED EMBODIMENTS

Reference will now be made in detail to the preferred embodiment of this invention, examples of which are illustrated in the accompanying drawings in which like reference characters refer to like elements.

Figure 1:
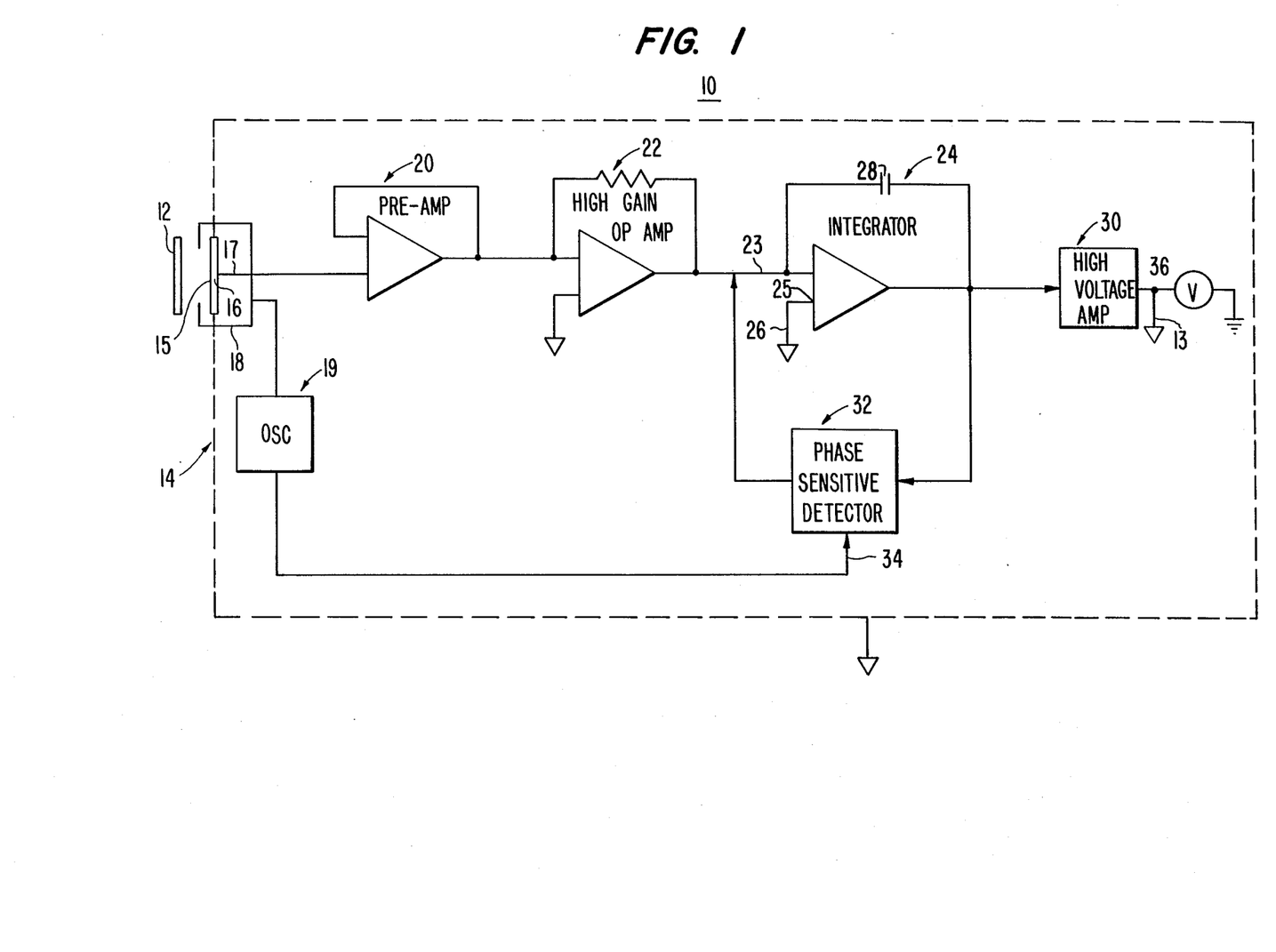
FIG. 1 is a block diagram of a preferred embodiment of the present invention.

Referring to FIG. 1, there is shown a non-contacting voltage metering apparatus 10 for monitoring the electrical potential between a test surface 12 and a universal reference 13, incorporating the teachings of the subject invention. Metering apparatus 10 includes a housing 14, establishing a local reference potential.

Mounted in housing 14 is a sensing electrode 16 which is positioned across from and in proximity to test surface 12 such that a surface 15 of sensing electrode 16 is capacitively coupled to test surface 12. The invention includes means for modulating the capacitive coupling between the test surface and the electrode surface at a predetermined frequency. The capacitive coupling between test surface 12 and surface 15 of sensing electrode 16 is modulated by less than one hundred percent and preferably by no more than fifty percent. As embodied herein, the modulating means comprises a tuning fork mechanism 18 which mechanically modulates the capacitive coupling between test surface 12 and the surface of sensing electrode 16. A tuning fork mechanism of the type described is disclosed in U.S. Pat. No. 3,921,087 to Vosteen. The frequency of vibration of sensing electrode 16 by tuning fork mechanism 18 is controlled by an oscillator 19 which is connected to tuning fork mechanism 18. The frequency of oscillator 19 is hereinafter referred to as a reference frequency.

The modulation of the capacitive coupling between test surface 12 and sensing electrode 16 induces a capacitive voltage on surface 15 of sensing electrode 16, the induced voltage being proportional to the voltage existing at test surface 12 which may include direct current (DC) and AC components.

As is well known to those skilled in the art, other means of modulating the capacitive coupling between test surface 12 and surface 15 of sensing electrode 16 may be provided, such as a rotating shutter or vibrating electrode.

Sensing electrode 16 has an output terminal 17 which is coupled to amplifying means having an input and an output for amplifying a voltage present on electrode output terminal 17. Preferably, electrode output terminal 17 is coupled to an input terminal of a preamplifier 20 which comprises a first stage of the amplifying means. The output of preamplifier 20 is preferably connected to a high gain wideband amplifier 22 which comprises a second stage of the amplifying means. Since the voltage induced on surface 15 of sensing electrode 16 is induced by what are, typically, small capacitance variations (on the order of picofarads), it is necessary in preserving the sensing electrode voltage to minimize the capacitive loading on sensing electrode 16. Accordingly, preamplifier 20 comprises a wideband operational amplifier having extremely high input resistance and low input capacitance. High gain operational amplifier 22 further amplifies the signal from sensing electrode 16 by a gain of, for example, 20. Both amplifier 20 and high gain operational amplifier 22 are wideband amplifiers responsive to low and high frequency signals.

The output of high gain operational amplifier 22 is coupled to one input 23 of integrator 24, the other input 25 of which is connected to housing 14 through a circuit common connection 26. The output of integrator 24 is coupled to a high voltage amplifier 30 having an output connected to the reference surface. The input of high voltage amplifier 30 is coupled to the output of integrator 24. The output of integrator 24 is coupled to the input of a phase sensitive detector 32. The output of phase sensitive detector 32 is connected to input 23 of integrator 24. Phase sensitive detector 32 includes a reference terminal 34 coupled to reference oscillator 19, and utilizes the signal supplied to reference terminal 34 by oscillator 19 to demodulate the input received from integrator 24. The input received from integrator 24 comprises a signal having an amplitude proportional to and a polarity the same as test surface 12. Since the voltage induced on sensing electrode 16 is induced by tuning fork mechanism 18 in accordance with the frequency of oscillator 24, the output of integrator 19 is a signal having a component the frequency of which is equivalent to the frequency of oscillator 19.

Phase sensitive detector 32 compares the oscillator signal at reference terminal 34 to the input signal from integrator 24 to produce a DC output which is fed back into integrator 24 to cancel the effect of the voltage-inducing oscillation. Accordingly, the output of phase sensitive detector 32 is a signal indicating the amplitude and polarity of test surface 12 as it would be measured by an ideal stationary voltage detector capable of contacting test surface 12 without affecting the voltage thereupon. Because the reference frequency is demodulated from the output of integrator 24 by phase sensitive detector 32, and not passed to circuit common (as in the prior art), the long-term stability of voltage metering apparatus 10 is enhanced.

The output of integrator 24 is coupled to the input of high voltage operational amplifier 30 to produce a high voltage output. The input to high voltage amplifier 30 may be on the order of, for example, 0 to 5 volts and the output may be on the order of, for example, 0 to 2000 volts.

The output of the voltage metering apparatus is used to drive circuit common to the potential of test surface 12. As circuit common 26 approaches the test surface potential, the voltage induced on sensing electrode 16 approaches zero, the potential on electrode output terminal 17 being a measure of the potential between circuit common 26 and the test surface potential. The test surface potential is obtained, therefore, by a measure of the potential between circuit common 26 of housing 14 and true ground. Apparatus 10 thus provides a highly stable and accurate voltage metering apparatus in which the high frequency response is limited only by the bandwidth of preamplifier 20, amplifier 22, integrator 24, and amplifier 30, and not by the frequency of oscillator 19.

Figure 2:
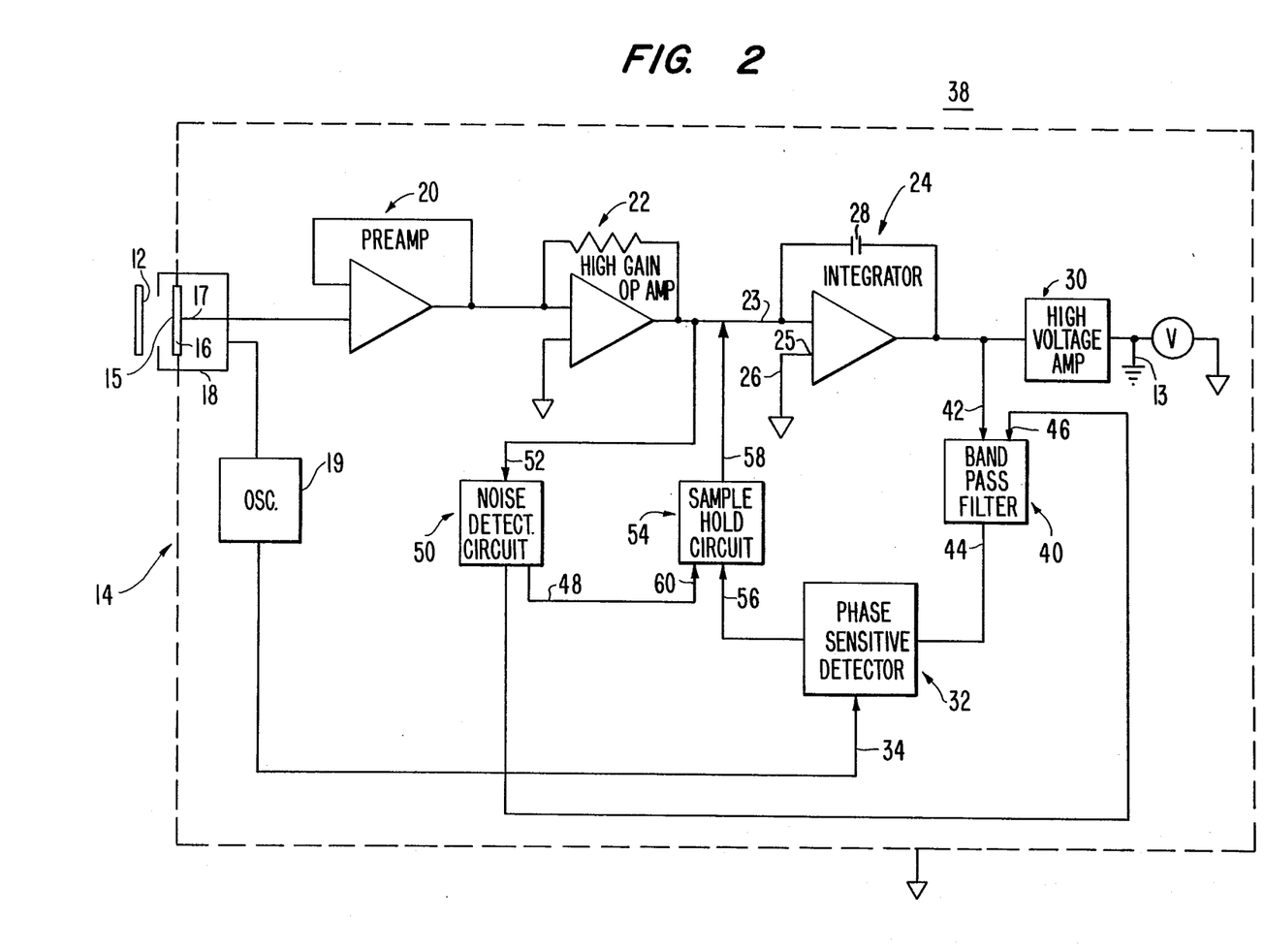
FIG. 2 is a block diagram of an alternative embodiment of the present invention.

FIG. 2 shows a voltage metering apparatus 38 constituting an alternative embodiment of the present invention. In addition to components described with regard to apparatus 10, the invention comprises means for disabling the feedback circuit upon occurrence of transient signals at the amplifying means output. As embodied herein, the disabling means includes a band pass filter 40, a noise detection circuit 60, and a sample-and-hold (SH) circuit 54. Band pass filter 40 has an input 42 connected to the output of integrator 24. Band pass amplifier 40 has an output 44 connected to the input of phase sensitive detector 32 and a disable terminal 46 connected to the output 48 of noise detection circuit 50. Noise detection circuit 50 has an input 52 connected to the output of amplifier 22.

Metering apparatus 38 also includes SH circuit 54 having an input 56 connected to the output of phase sensitive detector 32 and an output 58 connected to input 23 of integrator 24. SH circuit 54 also includes an enable terminal 60 connected to output 48 of noise detector 50. Band pass amplifier 40 and SH circuit 54 comprise part of the feedback circuit from the output of integrator 24 to the input of integrator 24.

Band pass amplifier 40 filters from the feedback circuit signals with frequencies not in the region of the reference frequency generated by oscillator 19. Signals having frequencies in the range of the reference frequency, for example, 800–1200 Hertz for a 1000 Hertz reference signal, are passed through phase sensitive detector 32 in order that the reference signal may be compared with the input signal to produce a signal which has been demodulated of the reference frequency, i.e., a signal having an amplitude and phase solely reflective of the voltage of test surface 12 and not superimposed on the reference signal. In this way, the reference signal is eliminated from the input to high voltage output 30 and therefore from the circuit common voltage so that the reference frequency signal will not cancel the voltage induced on sensing electrode 16, the voltage on sensing electrode being induced in accordance with the reference frequency.

Noise detection circuit 50 detects the presence of high amplitude transient signals which have the potential to cause inaccuracies in apparatus 38 by distorting the signal provided to integrator 24 by the feedback circuit including phase sensitive detector 32. Upon occurrence of a transient, a signal is supplied to input 46 to disable band pass amplifier 40 and to input 60 to enable SH circuit 54. SH circuit 54 then supplies a constant signal to input 23 of integrator 24 until decay of the transient, at which time SH circuit 54 is disabled and normal operation of band pass filter 40 is restored.

Figure 3:
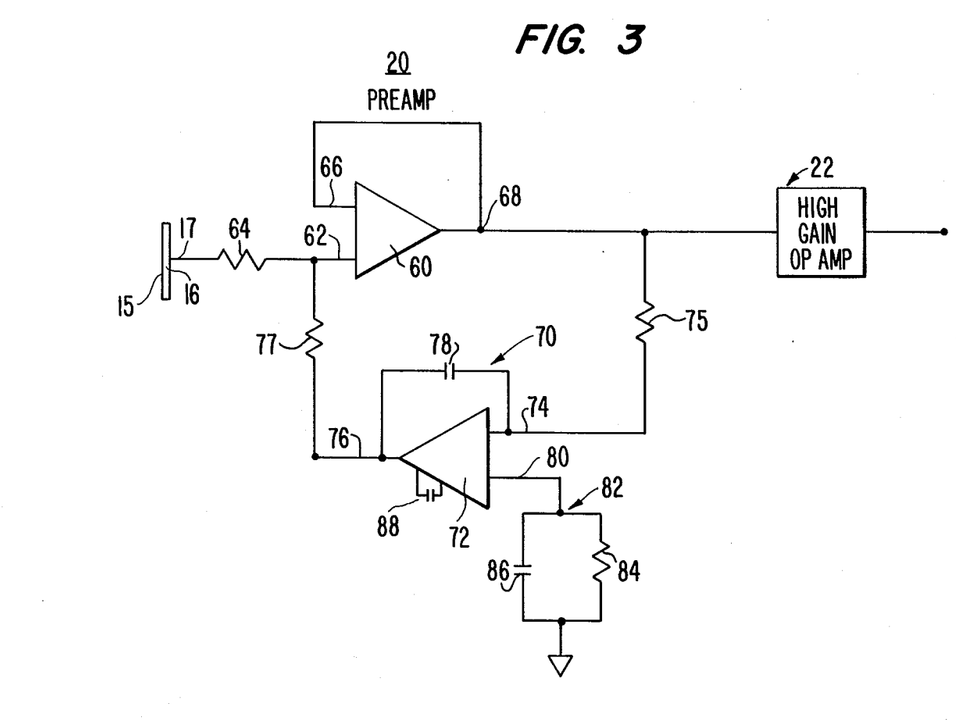
FIG. 3 is an electrical schematic diagram of the preamplifier shown in FIGS. 1 and 2.

Referring to FIG. 3, a wideband preamplifier 20 includes an operational amplifier 60. Output terminal 17 of sensing electrode 16 is coupled to an input 62 of operational amplifier 60 through a resistor 64. The other input 66 of operational amplifier 60 is connected to output 68 of operational amplifier 60. The input 62 of operational amplifier 60 is also coupled to the output of a preamplifier stabilizer 70. Preamplifier stabilizer 70 is an integrator with a feedback circuit from an input 74 to output 76 through a capacitor 78. Input 74 is also connected to the output of operational amplifier 60 through a resistor 75. The other input 80 of operational amplifier 70 is coupled to circuit common, i.e., housing 14 through a resistor-capacitor circuit 82 with a resistor 84 and a capacitor 86. Preamplifier stabilizer 70 also includes a capacitor 88.

Output 76 of preamplifier stabilizer 70 is connected to preamplifier input 62 through resistor 77. The invention thus includes means for stabilizing the output of preamplifier 20. As embodied herein, the stabilizing means comprises preamplifier stabilizer 70. In the preferred embodiment, operational amplifiers 60 and 72 may comprise models LF356 and LM308 devices, respectively, commercially available from the National Semiconductor Corporation.

Figure 4:
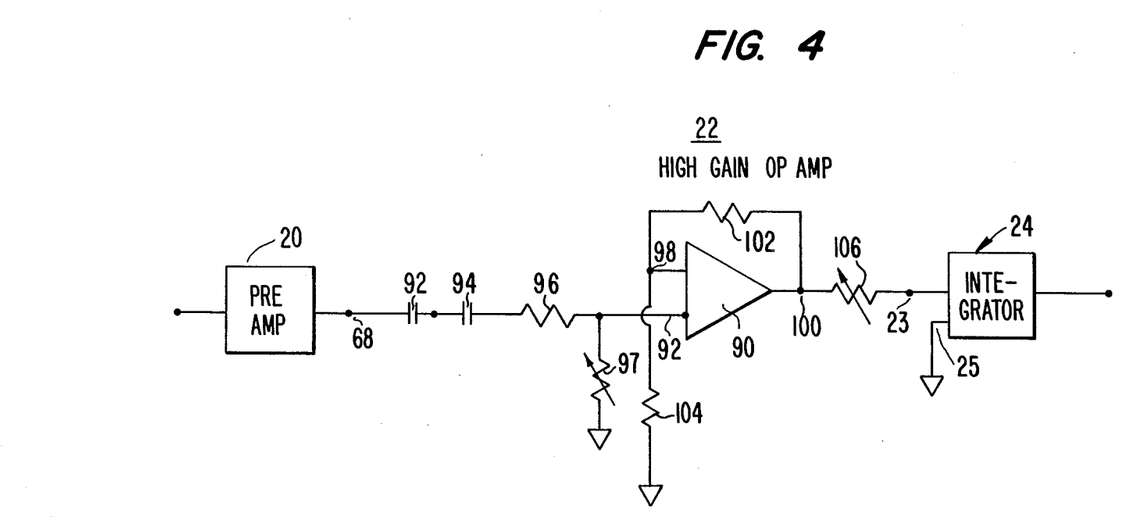
FIG. 4 is an electrical schematic diagram of the high-gain operational amplifier of shown in FIGS. 1 and 2.

Referring to FIG. 4, the construction of wideband operational amplifier 22 is shown in greater detail. Amplifier 22 includes operational amplifier 90, which may be, for example, a type LF356 device commercially available from the National Semiconductor Corporation. One input 92 of operational amplifier 90 is coupled to output 68 of preamplifier 20 through capacitors 92 and 94 and resistor 96, and coupled through a variable resistor 97 to circuit common for adjustment of system gain. The other input 98 of operational amplifier 90 is connected to output 100 of operational amplifier 90 through a resistor 102. Operational amplifier output 100 is connected to input 23 of integrator 24 through variable resistor 106. Operational amplifier input 98 is tied to circuit common, i.e., housing 14 through resistor 104.

Figure 5:
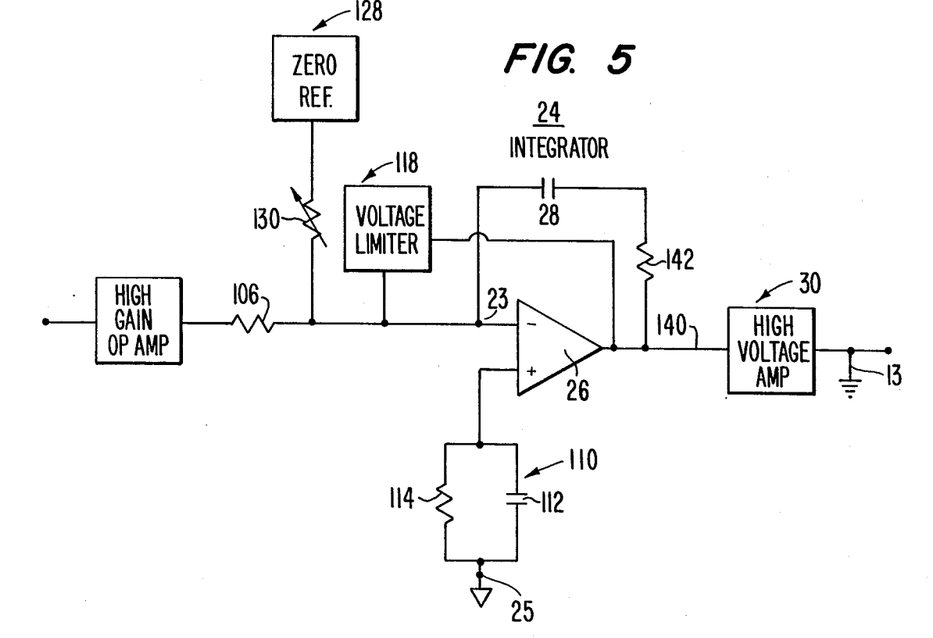
FIG. 5 is an electrical schematic diagram of the integrator shown in FIGS. 1 and 2.

Integrator 24 is shown in greater detail in FIG. 5. Integrator input 25 is connected to housing 14 and includes circuit 110 comprising capacitor 112 and resistor 114. Integrator input 23 is also connected to a voltage limiter 118. Voltage limiter 118 is used for "soft-clamping" to prevent integrator saturation which would disable system functioning. Also connected to integrator input 23 is a zero voltage reference 128 for instrument zero control. A variable resistor 130 is interposed between voltage reference 128 and input 23.

Operational amplifier 26 of integrator 24, which may be, for example, a type LF353 device commercially available from National Semiconductor Corporation, has an output 140 which is connected by a feedback circuit to input 23. The feedback circuit includes a resistor 142 between output 140 and capacitor 28, and capacitor 28 between resistor 142 and input 23. Voltage limiter 118 is also connected to output 140. Integrator 24 integrates the signal from high gain operational amplifier output 100, preserving the polarity of test surface 12 and driving the output 36 of high voltage output 30 toward the voltage present at test surface 12.

Figure 7:
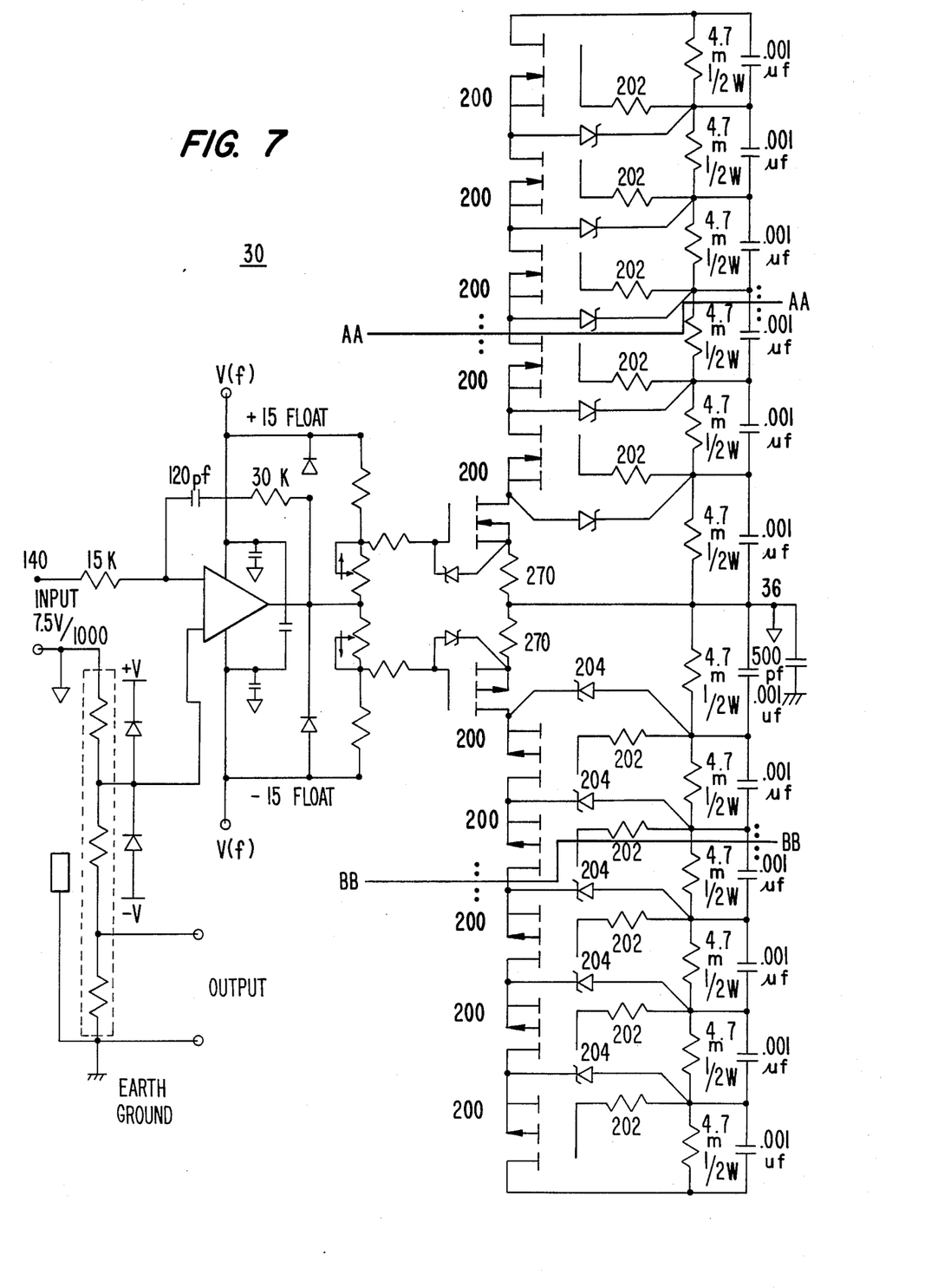
FIG. 7 is an electrical schematic diagram of the high voltage amplifier shown in FIGS. 1 and 2.

High voltage amplifier 30 receives signals having an amplitude on the order of volts, e.g., 0 to 5 volts from integrator output 140 and has an output on the order of thousands of volts, e.g., 0 to 2000. High voltage amplifier 30 increases the input signal which is proportional to the voltage of test surface 16 to a voltage which is on the same order as the voltage present at test surface 16. Circuit common 26, in the form of housing 14, is driven to the actual test surface voltage by output 36 of high voltage amplifier 30 thereby causing the voltage between circuit common 26 and test surface 12 to approach zero.

Oscillator 19 which controls the frequency of vibration of sensing electrode 16 and provides the reference frequency to terminal 34 of phase sensitive detector 32, is of a type generally used in voltage metering apparatus and known to those of ordinary skill in the art.

Figure 6:
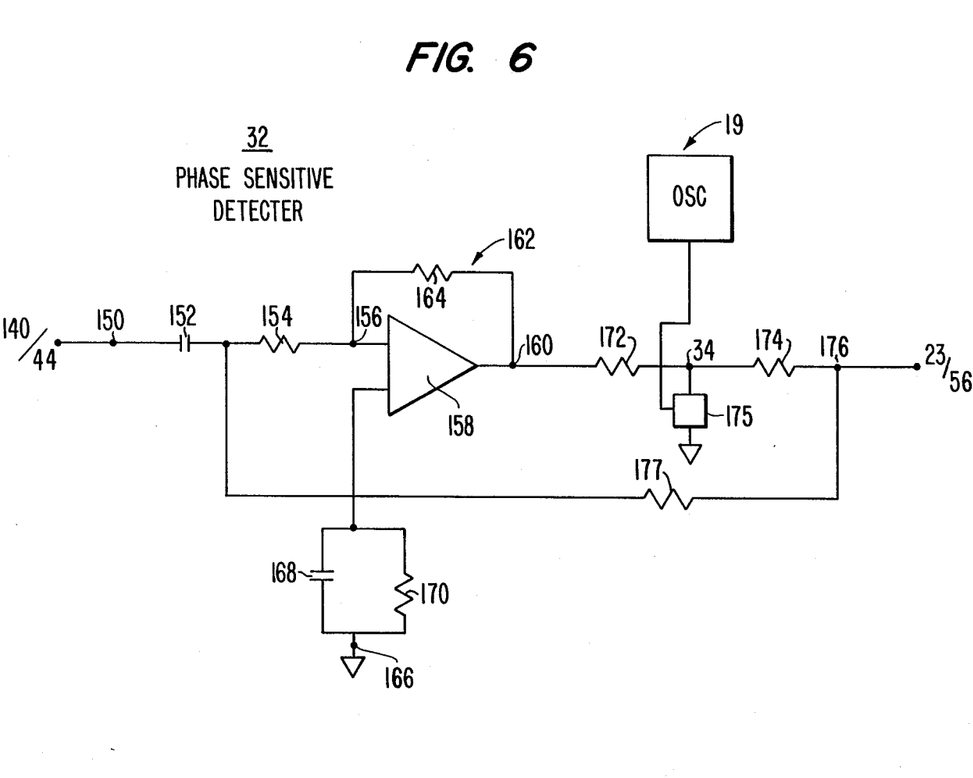
FIG. 6 is an electrical schematic diagram of the phase sensitive detector shown in FIGS. 1 and 2.

Phase sensitive detector 32 is shown in detail in FIG. 6. Phase sensitive detector 32 comprises an input 150 which is connected to integrator output 140 in metering apparatus 10 and band pass amplifier output 44 in metering apparatus 38. Input 150 is connected through a capacitor 152 and a resistor 154 to an input 156 of an operational amplifier 158 which may be, for example, a type LM308 device commercially available from National Semiconductor Corporation. An output 160 is connected to input 156 through a feedback circuit 162 comprising a resistor 164. An input 166 of operational amplifier 158 is connected to housing 14 and includes a circuit comprising a capacitor 168 and a resistor 170 in parallel. Output 160 is connected to reference terminal 34 through a resistor 172. Reference terminal 34 is also connected to one end of a resistor 174. The signal present at the other end of resistor 174 comprises an output 176 of phase sensitive detector 32. An oscillator-controlled gate 175 is used to forward the reference frequency to reference terminal 34. Output 176 is connected by a feedforward circuit to a node between capacitor 152 and resistor 154. Output 176 is also connected to integrator input 23 in metering apparatus 10 and to SH circuit input 56 in metering apparatus 38.

Referring to FIG. 7, high voltage amplifier 30 includes a plurality of T-MOS power Field Effect Transistors (FETs) 200 in a series resistor-capacitor divider controlled configuration. Resistors 202 in series with the FET gate leads prevent spurious oscillations in the voltage across the parallel capacitor-resistor circuits and to control the slew rate of FETs 200. Zener diodes 204 are used to clamp the FET gate-source voltage levels below which damage will occur. Lines AA and BB are illustrative of the fact that the circuit configuration may be repeated indefinitely to achieve a desired high voltage output level.

As described previously, band pass filter 40 is designed to operate in the range of the reference frequency at times when high amplitude transient signals have not been detected. Noise detector unit 50 disables band pass filter 40 whenever noise detector unit 50, which has an input 52 connected to the output of high gain operational amplifier 22, detects a high amplitude transient signal. When band pass filter 40 is disabled, SH circuit 54 is enabled by noise detector unit 50 through an enable terminal 60. SH circuit 54 receives the signal output from phase sensitive detector 32 at input 56 during times when high amplitude transient signals have not been detected. SH circuit 54 comprises a device (which may be, for example, a type LM308 integrated circuit device commercially available from the National Semiconductor Corporation with a J177FET from Siliconix Corporation) which holds the signal at input 56 for use during periods when the output of high gain operational amplifier 22 includes high amplitude transients and provides a constant signal to the input 23 of integrator 24 to preserve the long term stability of voltage metering even in the presence of transients.

It should be apparent to those skilled in the art that various modifications may be made to the voltage metering apparatus of the subject invention without departing from the scope and spirit of the invention. Thus, it is intended that the invention cover modifications and variations of the invention, provided they come within the scope of the appended claims and their legally entitled equivalents.

We claim:

1. A non-contacting voltage metering apparatus coupled to a test surface and to a universal reference for monitoring the electrical potential between the test surface and the universal reference, said metering apparatus comprising:
    a local reference surface;
    an electrode coupled to said reference surface and having an electrode surface and an output terminal, said electrode surface being capacitively coupled to said test surface;
    means for modulating the capacitive coupling between said test surface and said electrode surface at a predetermined frequency;
    amplifying means having an input and an output for amplifying a voltage present on said electrode output terminal;
    an integrator having an input and an output, said integrator input being coupled to said amplifying means output;
    a feedback circuit comprising a phase sensitive detector having an input coupled to said integrator output and an output coupled to said integrator input, and a reference terminal coupled to said modulating means for receiving said predetermined frequency, said feedback circuit providing said metering apparatus with D.C. stability to permit said apparatus to exhibit a high frequency response independent of said predetermined frequency; and
    a high voltage amplifier having an input coupled to said integrator output and an output connected to said universal reference.

2. The voltage metering apparatus of claim 1 wherein said amplifying means comprises:
    a wideband preamplifier having an input coupled to said electrode output terminal, and an output; and
    a wideband operational amplifier having an input coupled to said preamplifier output and an output coupled to said integrator.

3. The voltage metering apparatus of claim 2 wherein said preamplifier means includes means for stabilizing said output of said preamplifier means.

4. The voltage metering apparatus of claim 1 wherein said means for modulating capacitive coupling comprises means for vibrating the tines of a tuning fork interposed between said test surface and said electrode surface at said predetermined frequency.

5. The voltage metering apparatus of claim 1, wherein said means for modulating capacitive coupling comprises means for modulating capacitive coupling by less than fifty percent.

6. The voltage metering apparatus of claim 1 further comprises means for selectively disabling said feedback circuit.

7. The voltage metering apparatus of claim 6 wherein said disabling means comprises means for disabling said feedback circuit upon occurrence of transient signals at said amplifying means output.

8. The voltage metering apparatus of claim 7 wherein said disabling means comprises:
    a band pass amplifier having an input connected to said integrator output, an output coupled to said phase sensitive detector input, and a disable terminal;
    a sample-and-hold circuit having an input connected to said phase sensitive detector output, an output connected to said integrator input, and an enable terminal; and
    a noise detection circuit having an input connected to said amplifying means output and an output connected to said band pass amplifier disable terminal and to said sample-and-hold circuit enable terminal for enabling said sample and hold circuit and disabling said band pass amplifier upon occurrence of said transient signals at said amplifying means output.

9. The voltage metering apparatus as recited in claim 1, wherein said means for modulating capacitive coupling comprises a rotating shutter.

10. The voltage metering apparatus as recited in claim 1, wherein said means for modulating capacitive coupling comprises a vibrating electrode.

* * * * *